United States Patent
Lin et al.

(10) Patent No.: US 12,211,737 B2
(45) Date of Patent: Jan. 28, 2025

(54) CLEANING CHAMBER FOR METAL OXIDE REMOVAL

(71) Applicant: Taiwan Semiconductor Manufacturing Company, Ltd., Hsinchu (TW)

(72) Inventors: Yen-Liang Lin, Yilan County (TW); Chia-Wen Zhong, Taichung (TW); Yao-Wen Chang, Taipei (TW); Min-Chang Ching, Zhubei (TW); Kuo-Liang Lu, Hsinchu (TW); Cheng-Yuan Tsai, Chu-Pei (TW); Ru-Liang Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 397 days.

(21) Appl. No.: 17/459,137

(22) Filed: Aug. 27, 2021

(65) Prior Publication Data

US 2023/0062974 A1    Mar. 2, 2023

(51) Int. Cl.
*H01L 21/768*    (2006.01)
*H01J 37/32*    (2006.01)
(Continued)

(52) U.S. Cl.
CPC .... *H01L 21/76814* (2013.01); *H01J 37/3211* (2013.01); *H01L 21/0206* (2013.01);
(Continued)

(58) Field of Classification Search
None
See application file for complete search history.

(56) References Cited

U.S. PATENT DOCUMENTS 6,352,081 B1 * 3/2002 Lu ................. H01L 21/67028
134/1.1
6,482,331 B2    11/2002 Lu et al.
(Continued)

FOREIGN PATENT DOCUMENTS

EP    1081751 A2 *  3/2001  ........... B08B 7/0035
JP    H08330243 A    12/1996
(Continued)

OTHER PUBLICATIONS

JP-2008016869 English translation, accessed on May 2024. (Year: 2008).*

*Primary Examiner* — Eric W Golightly
*Assistant Examiner* — Arlyn I Rivera-Cordero
(74) *Attorney, Agent, or Firm* — Eschweiler & Potashnik, LLC

(57) ABSTRACT

In some embodiments, the present disclosure relates to a method that includes forming a dielectric layer over a conductive structure on a substrate. A removal process is performed to remove a portion of the dielectric layer to expose a portion of the conductive structure. The substrate is transported into a cleaning chamber having a wafer chuck below a bell jar structure. A cleaning process is performed to clean the exposed portion of the conductive structure by turning on a noble gas source to introduce a noble gas within the cleaning chamber, turning on an oxygen gas source to introduce oxygen within the cleaning chamber, applying a first bias to a plasma coil to form a plasma gas, and applying a second bias to the wafer chuck. The substrate is removed from the cleaning chamber. A conductive layer is formed over the dielectric layer and coupled to the conductive structure.

20 Claims, 12 Drawing Sheets

(51) Int. Cl.
 *H01L 21/02* (2006.01)
 *H01L 21/67* (2006.01)
 *H01L 21/687* (2006.01)

(52) U.S. Cl.
 CPC .. *H01L 21/02068* (2013.01); *H01L 21/67028* (2013.01); *H01L 21/67103* (2013.01); *H01L 21/68785* (2013.01); *H01L 21/76862* (2013.01); *H01J 2237/335* (2013.01)

(56) References Cited

U.S. PATENT DOCUMENTS

| | | | |
|---|---|---|---|
| 2003/0168004 A1* | 9/2003 | Nakata | H01L 21/02274 118/50.1 |
| 2003/0183244 A1 | 10/2003 | Rossman | |
| 2009/0029564 A1 | 1/2009 | Yamashita et al. | |
| 2014/0137976 A1* | 5/2014 | Miller | H01J 37/3244 118/723 R |

FOREIGN PATENT DOCUMENTS

| | | | | |
|---|---|---|---|---|
| JP | 2008016869 A | * | 1/2008 | ........ H01J 37/32082 |
| WO | WO-9958739 A1 | * | 11/1999 | ........... C23C 14/022 |

* cited by examiner

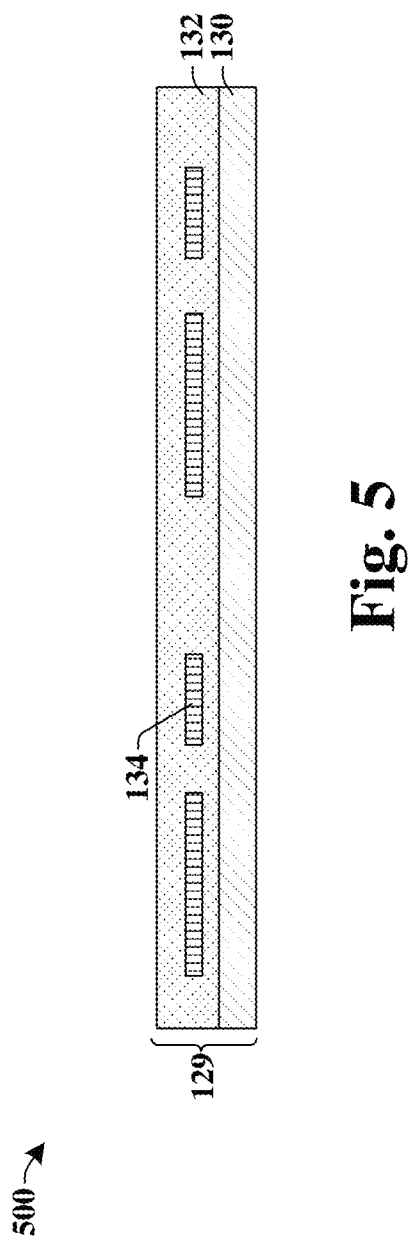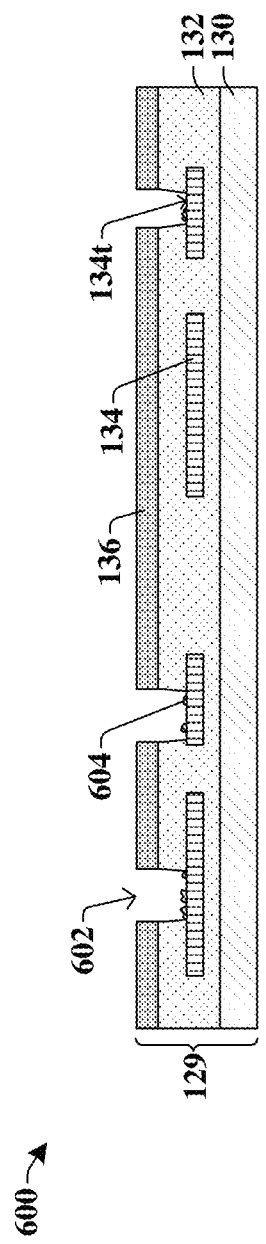

CLEANING CHAMBER FOR METAL OXIDE REMOVAL

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconducting material. Between the photolithographic and chemical processing steps, cleaning processes may be used to remove any contaminant particles to reduce physical and electrical defects in the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-11 illustrate cross-sectional views of some embodiments of a method of performing a cleaning process to remove metal oxide residue from a conductive structure by using a processing chamber comprising a bell jar structure, oxygen source, and heating elements.

DETAILED DESCRIPTION

Figure 1:
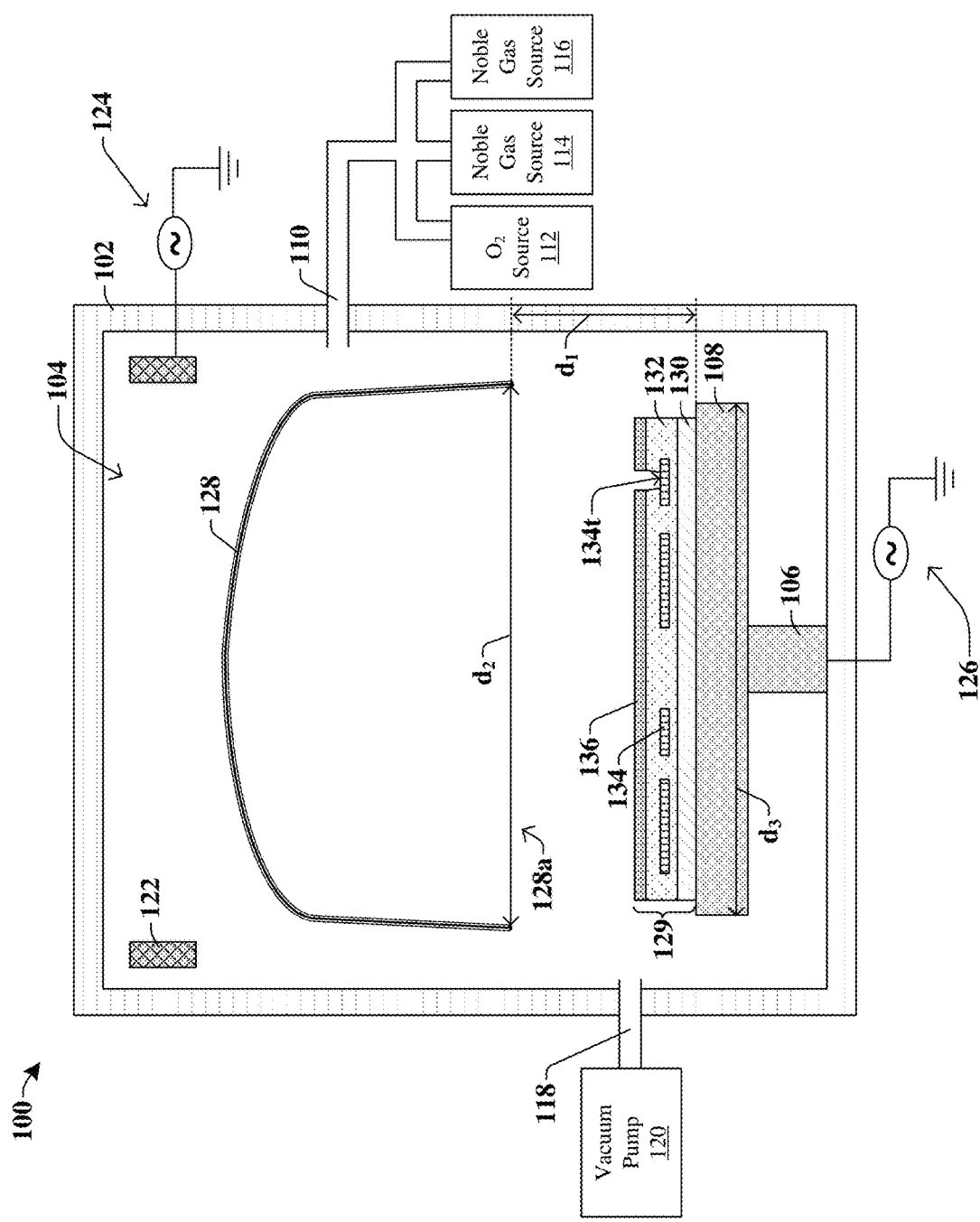
FIG. 1 illustrates a cross-sectional view of some embodiments of a cleaning apparatus comprising a bell jar structure arranged over a wafer chuck within a processing chamber, wherein an oxygen source is coupled to the processing chamber.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device often comprises multiple conductive structures arranged within dielectric layers, wherein signals (e.g., current, voltage) can travel through the multiple conductive structures. The conductive structures may be formed by various deposition, photolithography, and removal processes. Conductive structures often comprise a metal, which, when exposed to the environment during, for example, a removal process, may oxidize. Thus, during fabrication of conductive structures, cleaning processes are used to remove metal oxide residue on exposed portions of the conductive structures. By removing the metal oxide residue, adhesion between conductive structures and contact resistance between conductive structures are improved thereby increasing reliability of the overall semiconductor device.

Some cleaning processes include a physical sputtering cleaning process that relies on chemical reduction of metal oxides by plasma to remove the metal oxide residue from conductive structures. In a physical sputtering cleaning process, a wafer is arranged in a processing chamber, and a plasma gas bombards the metal oxide residue and the conductive structure to remove the metal oxide residue from the conductive structure. Although most of the metal oxide residue is pumped out of the processing chamber as metal, oxygen, and/or metal oxide, some of the metal oxidizes and redeposits onto the conductive structure and/or other layers before it can exit the chamber. Further, there are some metal oxides that are more likely to redeposit during a cleaning process such as, for example, tungsten oxide, aluminum oxide, or titanium oxide.

Various embodiments of the present disclosure relate to a cleaning apparatus and corresponding method to remove metal oxide residue from a conductive structure and mitigate redeposition of the metal oxide onto the conductive structure and/or other layers. In some embodiments, the cleaning apparatus comprises a chamber housing defining a processing chamber. A wafer chuck is arranged within the processing chamber and is configured to hold a substrate for cleaning. A bell jar structure is arranged over the wafer chuck. The bell jar structure comprises an opening that faces the wafer chuck. In some embodiments, the cleaning apparatus further comprises a plasma coil arranged over the bell jar structure and gas sources coupled to the processing chamber through gas input piping.

In some embodiments, one of the gas sources comprises an oxygen source. Thus, during the cleaning process, oxygen is pumped into the processing chamber such that when metal from the metal oxide residue is removed from plasma bombardment, the metal may react with the oxygen and redeposit onto the bell jar structure as a metal oxide, and not onto the conductive structure and/or other layers. Because metal oxide is deposited onto the bell jar structure and not metal only, a shielding effect between a metal covered bell jar structure and the plasma gas is avoided. In some embodiments, the processing chamber further comprises one or more heating elements directed towards the bell jar structure to further promote oxidation of the metal oxide onto surfaces of the bell jar and not onto the conductive structure and/or other layers. In some embodiments, multiple noble gases are inputted into the processing chamber as well to promote the chemical reduction of the metal oxide residue for removal of the metal oxide residue. Thus, the present disclosure provides multiple configurations of a processing chamber used to improve removal of a metal oxide residue on a conductive structure by redepositing the metal as metal oxide on a bell jar structure instead of redeposition of the metal or metal oxide onto the conductive structure and/or other layers.

FIG. 1 illustrates a cross-sectional view 100 of some embodiments of a cleaning apparatus comprising a bell jar structure and an oxygen source in a processing chamber.

The cleaning apparatus of FIG. 1 includes a processing chamber housing 102 defining a processing chamber 104. In some embodiments, the processing chamber 104 is configured for use for a cleaning process. In some embodiments, a vacuum pump 120 is coupled to the processing chamber 104 through output piping 118, and the vacuum pump 120 is configured to create vacuum conditions in the processing chamber 104 when the cleaning apparatus is being used for a cleaning process. In some embodiments, an oxygen source 112, a first noble gas source 114, and a second noble gas source 116 are coupled to the processing chamber 104 through input piping 110. In some embodiments, the second noble gas source 116 may be omitted such that only the first noble gas source 114 is inputted into the processing chamber 104 during a cleaning process. In some embodiments, the first noble gas source 114 comprises a noble gas such as, for example, argon, krypton, or some other suitable noble gas. In some embodiments, the second noble gas source 116 provides a different noble gas into the processing chamber 104 than the first noble gas source 114. In some embodiments, the second noble gas source 116 may comprise a noble gas such as, for example, argon, krypton, or some other suitable noble gas.

In some embodiments, a wafer chuck 108 is arranged near a bottom of the processing chamber 104. In some embodiments, the wafer chuck 108 is arranged over a pedestal 106. The wafer chuck 108 is configured to hold onto a wafer 129 during a cleaning process. In some embodiments, the wafer 129 comprises layers over a substrate 130. For example, in some embodiments, the wafer 129 comprises conductive structure 134 arranged within dielectric layers 132 over the substrate 130. In some embodiments, a masking structure 136 is also arranged over the dielectric layers 132, and a topmost surface 134t of one of the conductive structures 134 is exposed to the processing chamber 104. In some embodiments, the conductive structure 134 comprises a metal such as, for example, copper, aluminum, tungsten, tantalum, titanium, or some other suitable conductive metal. In some embodiments, when the topmost surface 134t of the conductive structure 134 is exposed to the environment and/or removal processes, it oxidizes, thereby forming a metal oxide residue (not shown) on the topmost surface 134t of the conductive structure 134. Thus, the cleaning apparatus of FIG. 1 is configured to perform a plasma cleaning process to clean the topmost surface 134t of the exposed portion of the conductive structure 134 by removing the metal oxide residue.

In some embodiments, a plasma coil 122 is arranged near a top portion of the processing chamber 104 and over the wafer chuck 108. In some embodiments, the plasma coil 122 has a ring-like structure from a top-view perspective. In some embodiments, the plasma coil 122 is coupled to RF power circuitry 124 that is configured to operate at an RF frequency. During operation of the cleaning process, at least the first noble gas source 114 is configured to input a noble gas into the processing chamber. When the RF power circuitry 124 is applied to the plasma coil 122, an electric and/or magnetic field is generated which transfers energy to the noble gas within the processing chamber to form the plasma gas. In some embodiments, chuck circuitry 126 is coupled to the pedestal 106 and wafer chuck 108. During the cleaning process, the chuck circuitry 126 is configured to apply a bias to the wafer chuck 108 such that the plasma gas is attracted towards the biased wafer chuck 108 to bombard the wafer 129 with plasma gas for removal of metal oxide residue.

In some embodiments, a bell jar structure 128 is arranged within the processing chamber 104 and is arranged over the wafer chuck 108. In some embodiments, the bell jar structure 128 is arranged between the plasma coil 122 and the wafer chuck 108. An opening 128a of the bell jar structure 128 faces wafer chuck 108. In some embodiments, the bell jar structure 128 comprises a glass, such as a silicon oxide glass, for example. In some embodiments, a bottom of the bell jar structure 128 is spaced apart from the wafer chuck 108 by a first distance $d_1$. In some embodiments, the first distance $d_1$ is a non-zero distance such that the bell jar structure 128 is spaced apart from the wafer chuck 108 and a wafer 129 arranged on the wafer chuck. In some embodiments, the first distance $d_1$ is in a range of between, for example, approximately 1 millimeter and approximately 10 centimeters. In some embodiments, the opening 128a of the bell jar structure 128 has a width equal to a second distance $d_2$. In some embodiments, the second distance $d_2$ is in a range of between, for example, approximately 30 centimeters and approximately 50 centimeters. In some embodiments, the wafer chuck 108 has a width equal to a third distance $d_3$. In some embodiments, the second distance $d_2$ of the opening 128a of the bell jar structure 128 is greater than or equal to the third distance $d_3$ of the wafer chuck 108. Thus, in some embodiments, the opening 128a of the bell jar structure 128 completely overlies the wafer chuck 108.

In some embodiments, during the cleaning process, an oxygen source 112 is coupled to the processing chamber 104 and configured to input oxygen gas into the processing chamber 104. In some embodiments, when plasma gas bombards with a metal oxide residue arranged on the wafer 129, the metal and oxide are chemically separated and are removed through the output piping 118. In some embodiments, some of the metal will react with the oxygen gas from the oxygen source 112 to form a metal oxide and redeposit on the bell jar structure 128 instead of back onto the wafer 129. Further, in some embodiments, the second noble gas source 116 is configured to provide another noble gas into the processing chamber 104 to act as a combustion agent and increase the oxidation of metal onto the bell jar structure 128. Thus, in some embodiments, the bell jar structure 128, the oxygen source 112, and the second noble gas source 116 mitigate redeposition of metal oxide onto the wafer 129 to improve the cleaning process.

Figure 2:
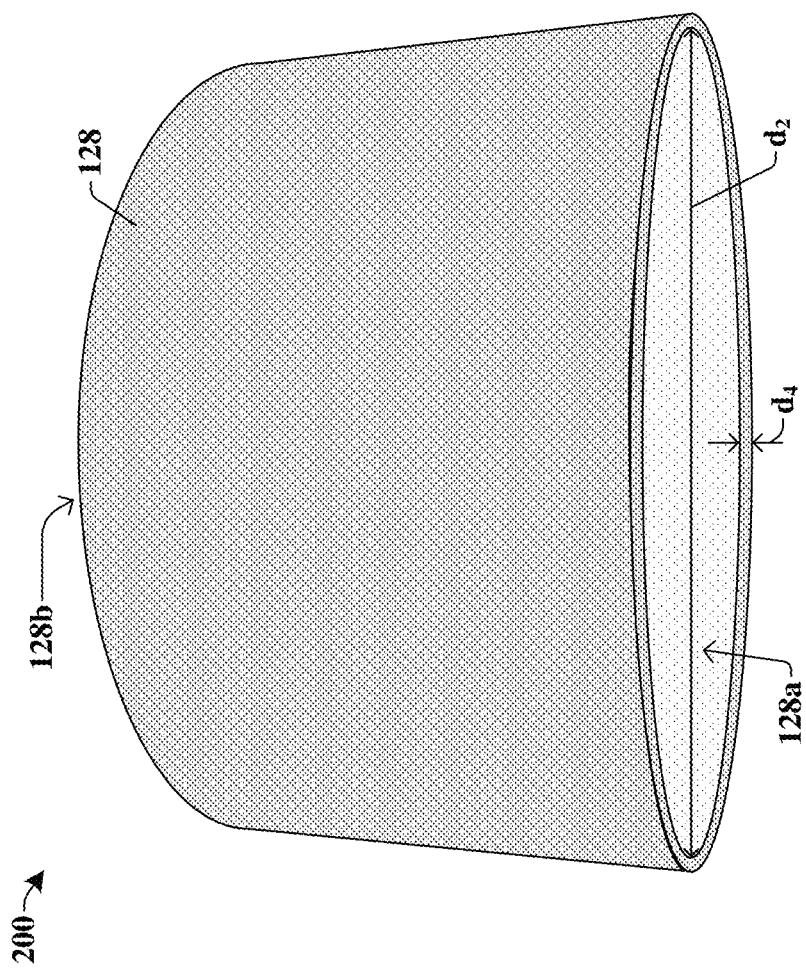
FIG. 2 illustrates a perspective view of some embodiments of a bell jar structure.

FIG. 2 illustrates a perspective view 200 of some embodiments of a bell jar structure.

In some embodiments, the bell jar structure 128 is a cone-like structure comprising the opening 128a and a rounded, closed top portion 128b. In some embodiments, walls of the bell jar structure 128 has a thickness equal to a fourth distance $d_4$. In some embodiments, the fourth distance $d_4$ is in a range of between, for example, approximately 1 millimeter and approximately 10 millimeters. In some embodiments, the second distance $d_2$ of the opening 128a of the bell jar structure 128 is a maximum width of the opening 128a of the bell jar structure 128. It will be appreciated that other variations of the shape of the bell jar structure 128 is within the scope of this disclosure. For example, in some embodiments, the opening 128a of the bell jar structure 128 may be a circle, whereas in some other embodiments, the opening 128a of the bell jar structure 128 may be more oval-like. Further, for example, in some embodiments, the cross-sectional view of the bell jar structure 128 in FIG. 1 may exhibit some planar sidewalls, whereas in some other embodiments, the cross-sectional view of the bell jar structure 128 in FIG. 1 may exhibit sidewalls that all are substantially curved.

Figure 3:
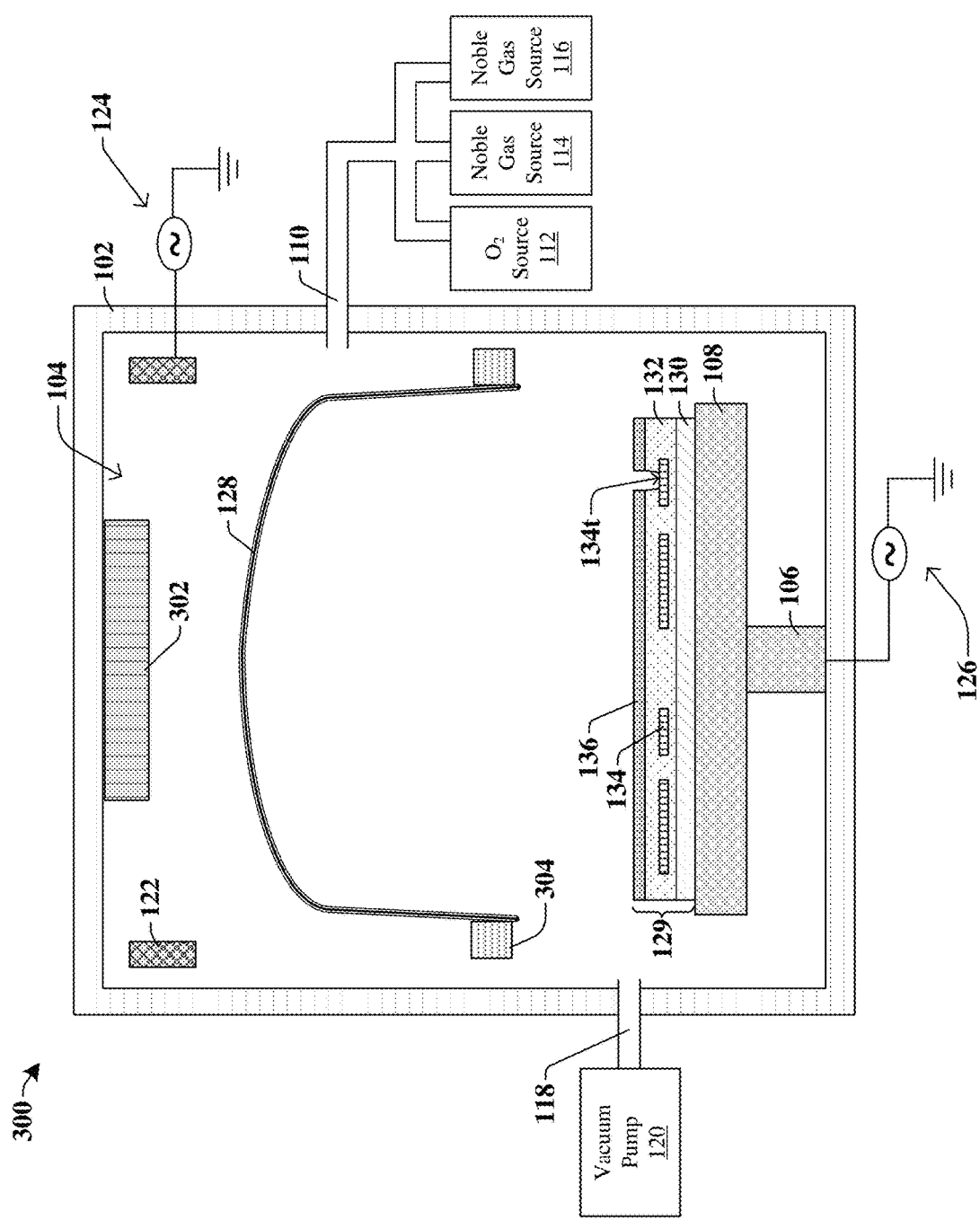
FIG. 3 illustrates a cross-sectional view of some other embodiments of a cleaning apparatus comprising a bell jar structure arranged over a wafer chuck and heating elements arranged inside the processing chamber.

FIG. 3 illustrates a cross-sectional view 300 of some other embodiments of a cleaning apparatus comprising a bell jar structure, an oxygen source, and one or more heating elements in a processing chamber.

In some embodiments, the cleaning apparatus further comprises a first heating element 302 arranged over the bell jar structure 128. In some embodiments, the first heating element 302 is a lamp or some other heating element and is configured to increase a temperature of the processing chamber 104 and the bell jar structure 128. In some embodiments, the first heating element 302 is arranged on an inner wall of the processing chamber housing 102. In some other embodiments, the first heating element 302 may be arranged beside the bell jar structure 128 and on an inner wall of the processing chamber housing 102.

In some embodiments, a second heating element 304 is arranged on the bell jar structure 128. In some embodiments, the second heating element 304 is a ring-like structure and surrounds an outer sidewall of the bell jar structure 128. In some other embodiments, the second heating elements 304 comprises multiple lamp-like structures spaced apart from one another but surrounding the outer sidewall of the bell jar structure 128. In some embodiments, the second heating element 304 is a lamp, a heat jacket, or some other heating element. In some embodiments, the second heating element 304 is also configured to increase a temperature of the bell jar structure 128. In some embodiments, the cleaning apparatus comprises the first heating element 302 only, the second heating element 304 only, the first and second heating elements 302, 304, or the first and second heating elements 302, 304 as well as additional heating elements.

In some embodiments, the first and second heating elements 302, 304 are each controlled by circuitry (not shown). The heating elements 302, 304 are arranged on or near the bell jar structure 128 to promote the oxidation reaction between metal and the oxygen gas near the bell jar structure 128 such that metal oxide forms on the bell jar structure 128 instead of on the wafer 129, thereby improving the cleaning process of metal oxide residue from the wafer 129.

Figure 4:
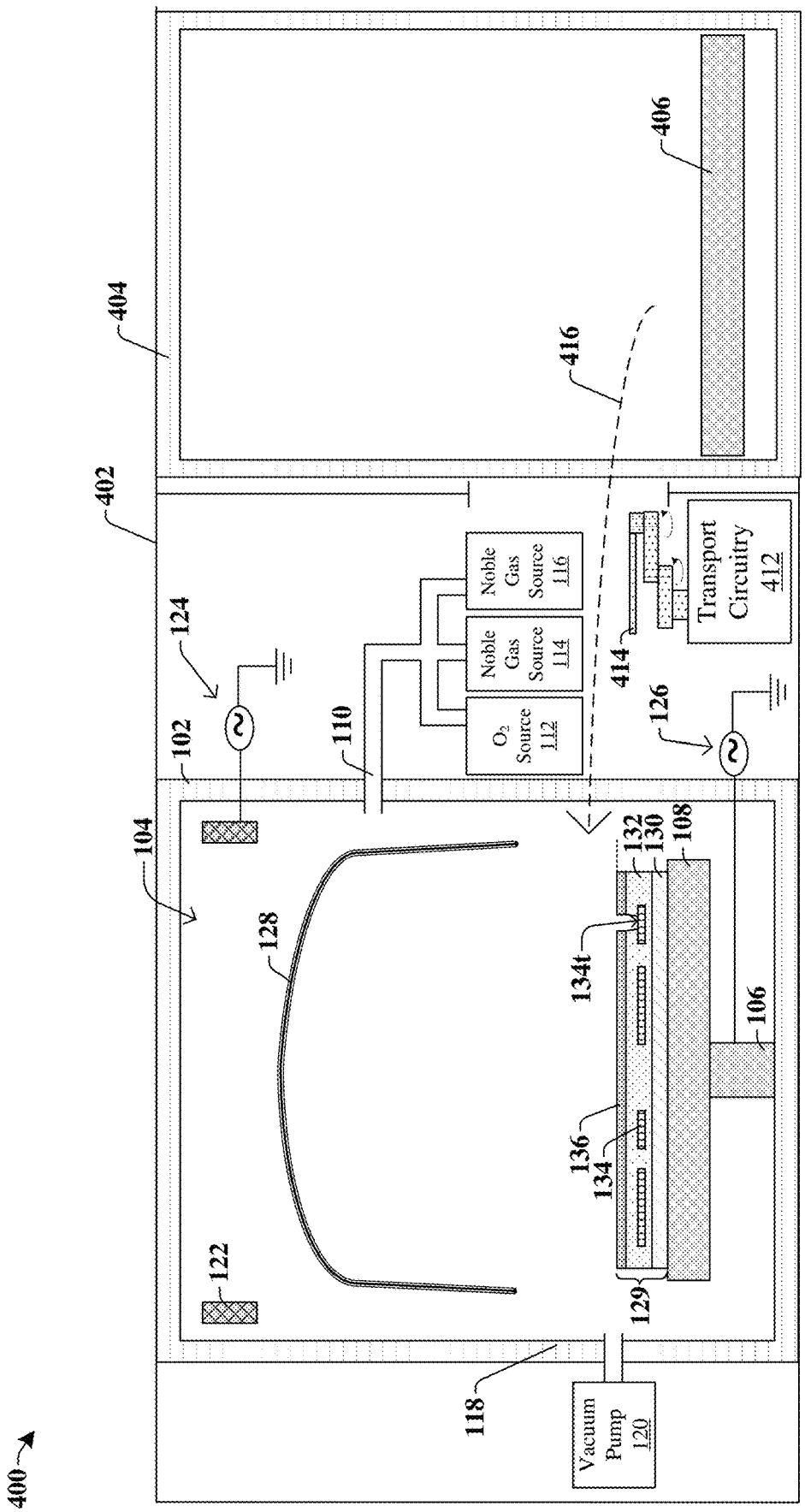
FIG. 4 illustrates a cross-sectional view of some embodiments of the cleaning apparatus coupled to another processing chamber.

FIG. 4 illustrates a cross-sectional view 400 of some embodiments of the cleaning apparatus of FIG. 1 coupled to another processing chamber.

In some embodiments, the cleaning apparatus of FIG. 1 is part of a larger tool housing 402. For example, in some embodiments, an additional processing chamber defined by additional processing chamber housing 404 is arranged within the tool housing 402. In some embodiments, the additional processing chamber may be, for example, a chamber used for removal process such as an etching chamber. In some embodiments, an additional wafer chuck 406 may be arranged within the additional processing chamber housing 404, and a transport robot 414 may be configured to transport 416 the wafer 129 from the additional processing chamber to the processing chamber 104 for cleaning. In some embodiments, the transport robot 414 may comprise a robotic arm configured to transport the wafer 129 without damaging the wafer 129. In some embodiments, the transport robot 414 is controlled by transport circuitry 412. In some embodiments, the processing chamber housing 102 and the additional processing chamber housing 404 are configured to be opened and closed for transport of the wafer 129. It will be appreciated that other chambers and/or features of the tool housing 402 are also within the scope of this disclosure.

FIGS. 5-11 illustrate cross-sectional views 500-1100 of some embodiments of a method of cleaning a wafer to remove metal oxide residue and preventing redeposition of metal oxide reside by using a cleaning apparatus comprising a bell jar structure, oxygen source, noble gas source, and/or heating elements. Although FIGS. 5-11 are described in relation to a method, it will be appreciated that the structures disclosed in FIGS. 5-11 are not limited to such a method, but instead may stand alone as structures independent of the method.

As shown in cross-sectional view 500 of FIG. 5, in some embodiments, a wafer 129 is provided. In some embodiments, the wafer 129 may comprise any type of semiconductor body (e.g., silicon/CMOS bulk, SiGe, SOI, etc.) such as a semiconductor wafer or more die on a wafer, as well as any other type of semiconductor and/or epitaxial layers formed thereon and/or otherwise associated therewith. For example, in FIG. 5, the wafer 129 at least comprises dielectric layers 132 arranged over a substrate 130. In some embodiments, the substrate 130 comprises a semiconductor material such as, for example, silicon, germanium, or the like. In some other embodiments, the substrate 130 may comprise other materials such as, for example, a glass. In some embodiments, the dielectric layers 132 are formed over the substrate 130 by way of a deposition process (e.g., physical vapor deposition (PVD), chemical vapor deposition (CVD), atomic layer deposition (ALD), or the like). In some embodiments, the dielectric layers 132 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the wafer 129 further comprises conductive structures 134 formed between the dielectric layers 132. In some embodiments, the conductive structures 134 are formed through various steps comprising deposition processes (e.g., PVD, CVD, ALD, sputtering, etc.), removal processes (e.g., wet etching, dry etching, chemical mechanical planarization (CMP), etc.), and/or patterning processes (e.g., photolithography/etching). In some embodiments, the conductive structures 134 comprise a conductive material such as, for example, copper, aluminum, tungsten, tantalum, titanium, or some other suitable conductive material. In some embodiments, the conductive structures 134 are or comprise electrodes, wires, vias, or some other conductive structure in a semiconductor device.

As shown in cross-sectional view 600 of FIG. 6, in some embodiments, a masking structure 136 is formed over the dielectric layers 132. In some embodiments, the masking structure 136 is formed through various steps of photolithography and removal (e.g., etching) processes. In some embodiments, the masking structure 136 comprises a photoresist material or a hard mask material, for example. In some embodiments, the masking structure 136 is patterned to have openings 602. In some embodiments, a removal process is then performed according to the masking structure 136 to remove portions of the dielectric layer 132 arranged below the openings 602 of the masking structure 136. In some embodiments, the removal process comprises a wet or dry etching process. In some embodiments, after the removal process, topmost surfaces 134t of one or more of the conductive structures 134 are exposed to the environment. In some embodiments, because the conductive structures 134 comprise a metal or some other material susceptible to oxidation, a metal oxide residue 604 (or some other oxide residue) may form on the topmost surfaces 134t of the conductive structures 134.

Figure 7:
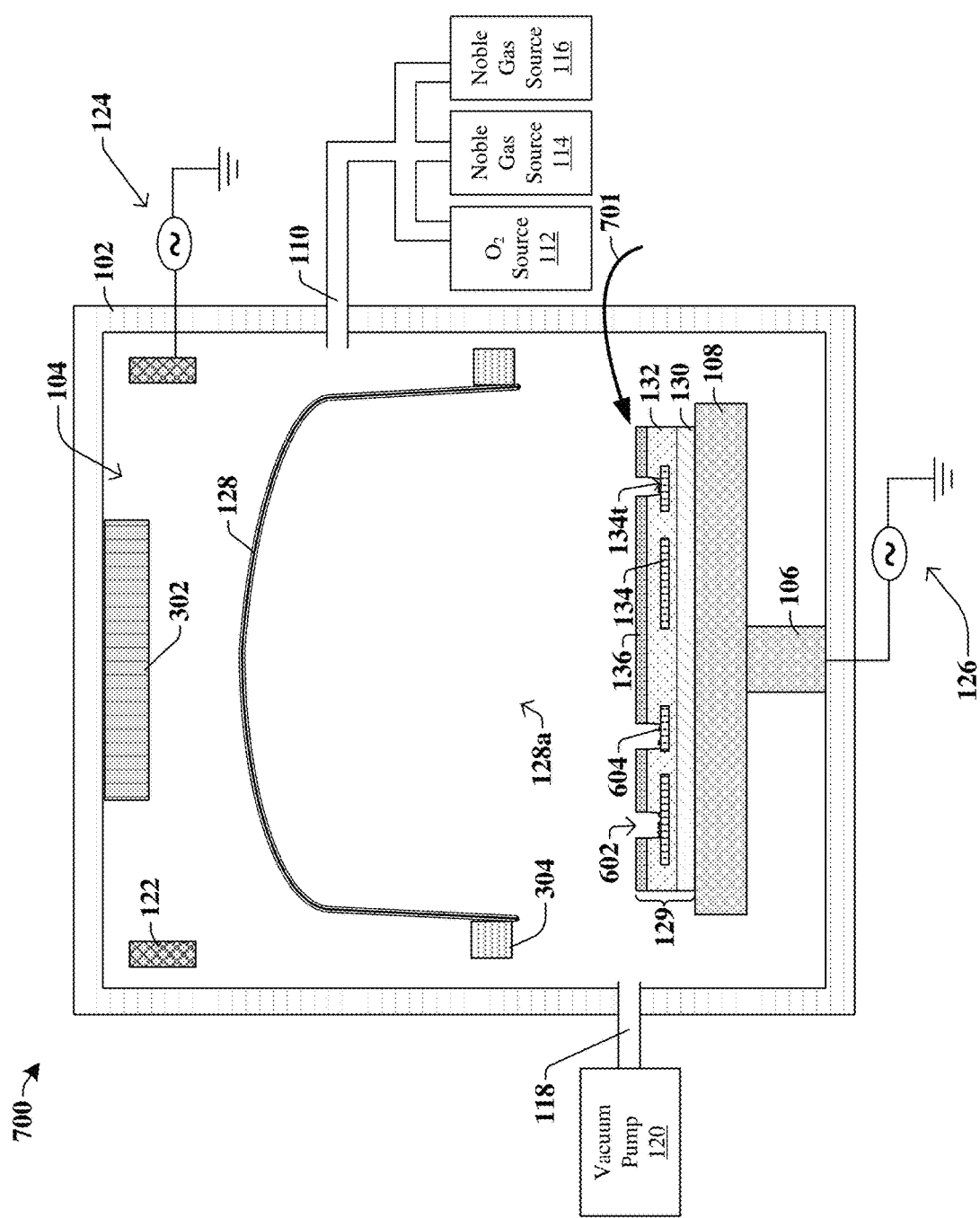

As shown in cross-sectional view 700 of FIG. 7, in some embodiments, the wafer 129 is transported 701 onto a wafer chuck 108 in a processing chamber 104 configured to remove the metal oxide residue 604 from the wafer 129. In some embodiments, the wafer 129 is transported between a removal chamber and into the processing chamber 104 using a transport robot such as, for example, the transport robot 414 of FIG. 4. Further, in some embodiments, the wafer 129 is aligned over the wafer chuck 108 through various alignment techniques such as wafer notch alignment, optical alignment, or some other suitable alignment technique.

In some embodiments, the cleaning apparatus comprises the processing chamber housing 102 defining a processing chamber 104. In some embodiments, the processing chamber 104 comprises the wafer chuck 108 arranged over a pedestal 106 and coupled to chuck circuitry 126. In some embodiments, a vacuum pump 120 is coupled to the processing chamber 104 through output piping 118. In some embodiments, an oxygen source 112, a first noble gas source 114, and a second noble gas source 116 are coupled to the processing chamber 104 through input piping 110. In some embodiments, a plasma coil 122 is arranged near an upper portion of the processing chamber 104 and is coupled to RF power circuitry 124. In some embodiments, a bell jar structure 128 is arranged between the plasma coil 122 and the wafer chuck 108, wherein an opening 128a of the bell jar structure 128 faces the wafer chuck 108.

Further, in some embodiments, a first heating element 302 is arranged over the bell jar structure 128. In some embodiments, a second heating element 304 is arranged on and around the bell jar structure 128. In other embodiments, the first and second heating elements 302, 304 are omitted.

Figure 8A:
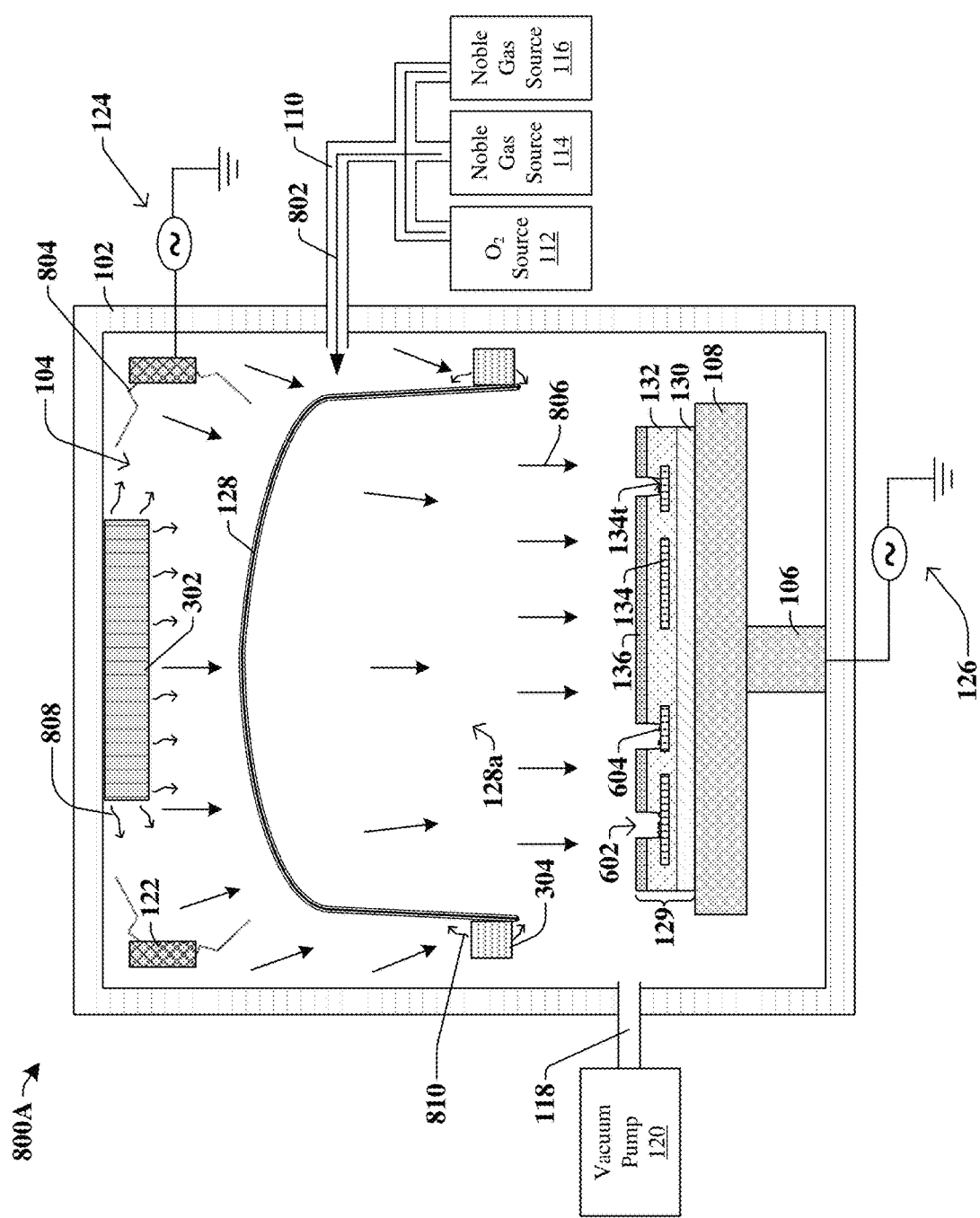
Figure 8B:
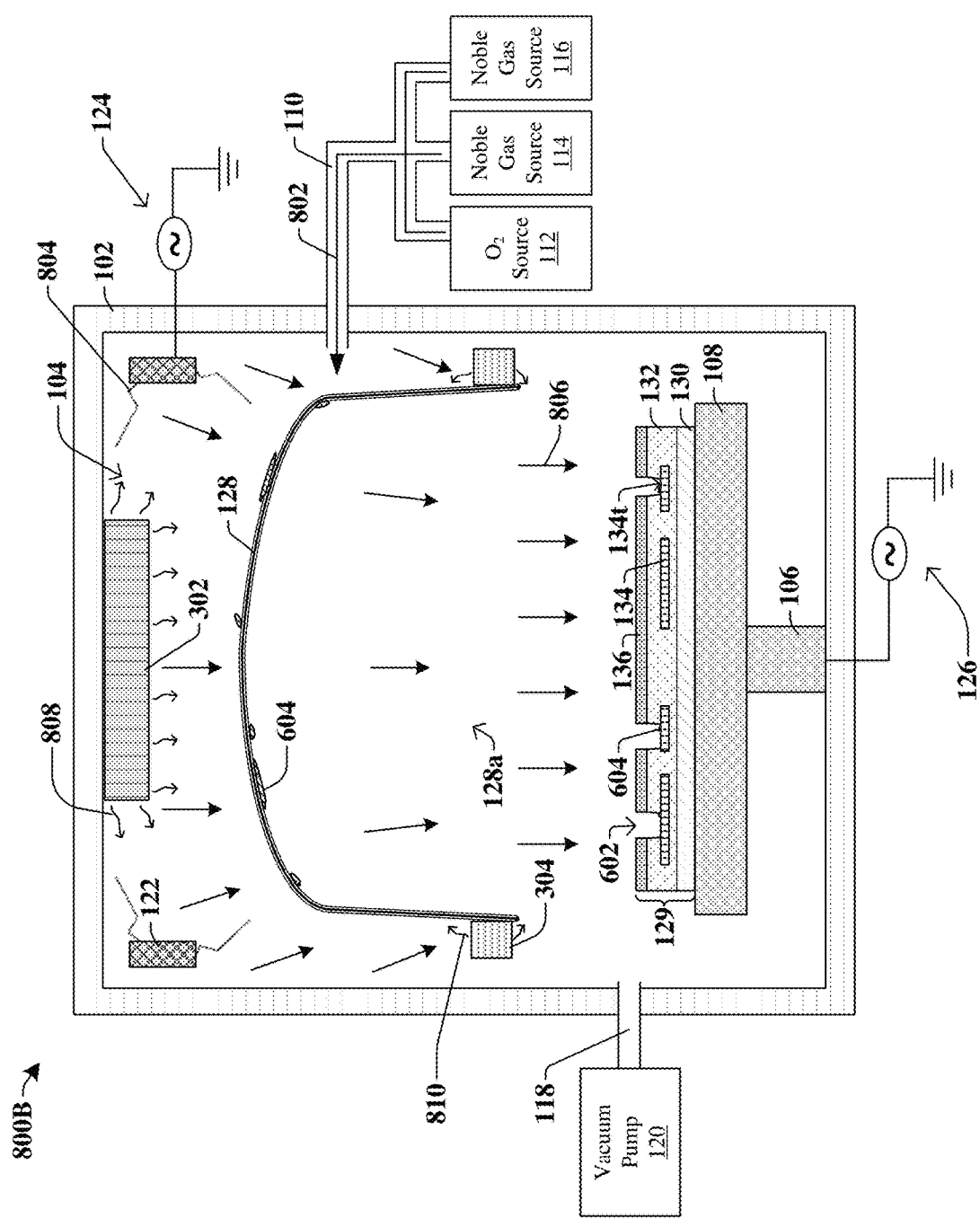
Figure 8C:
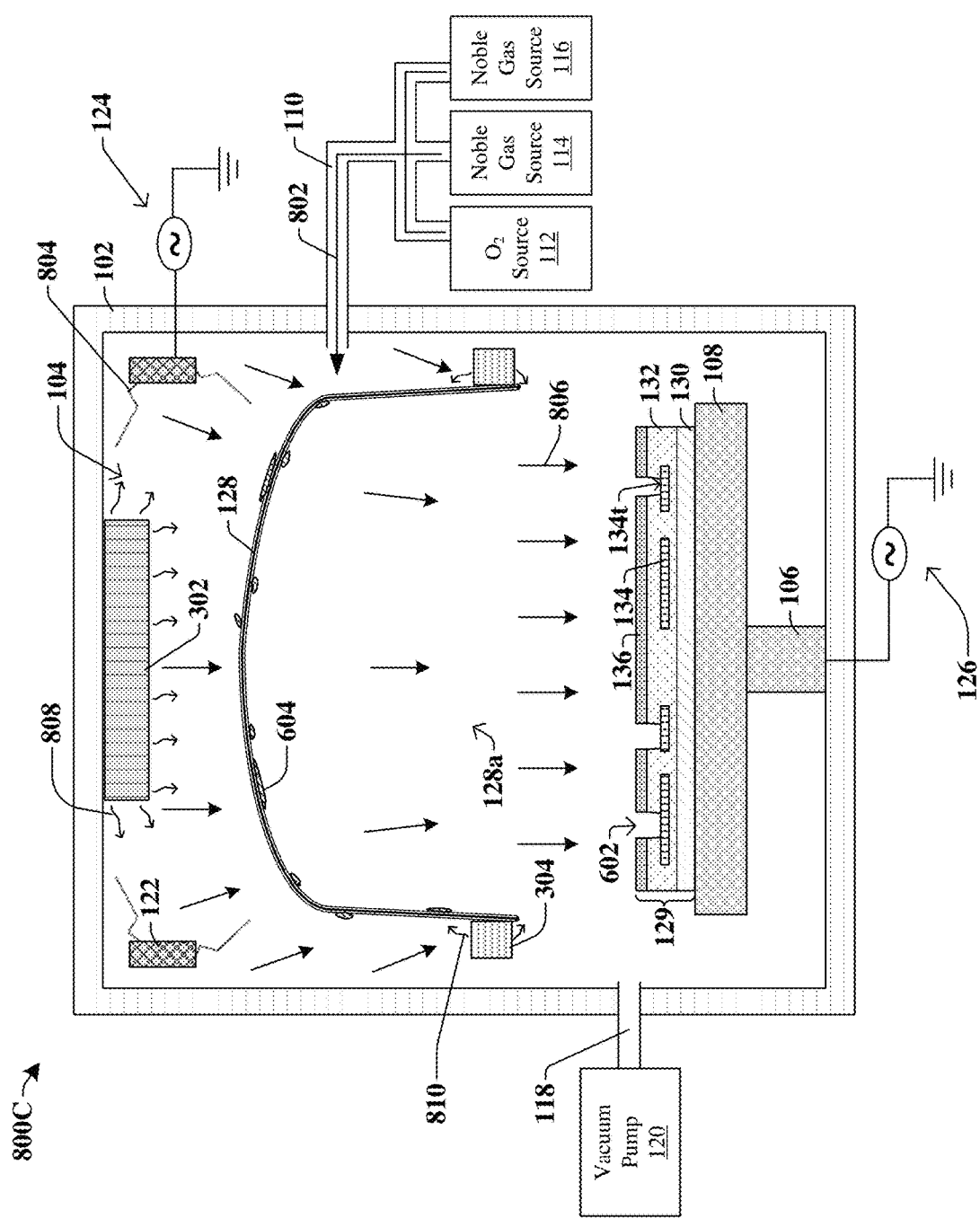

FIGS. 8A, 8B, 8C illustrate cross-sectional views 800A, 800B, and 800C, respectively, of a cleaning process comprising plasma gas bombardment directed toward the wafer 129 to remove the metal oxide residue 604 from the wafer 129. In some embodiments, FIG. 8A illustrates a first time of the cleaning process; FIG. 8B illustrates a second time of the cleaning process that is after the first time; and FIG. 8C illustrates a third time of the cleaning process that is after the first and second times. It will be appreciated that FIGS. 8A, 8B, and 8C illustrate a single cleaning process, but at different times during the cleaning process to understand how metal oxide residue 604 is removed from the wafer 129.

As shown in the cross-sectional view 800A of FIG. 8A, in some embodiments, the vacuum pump 120 is turned ON to create vacuum conditions in the processing chamber 104. Further, in some embodiments, the oxygen source 112, the first noble gas source 114, and the second noble gas source 116 are turned ON to input oxygen gas, a first noble gas, and a second noble gas into the processing chamber 104 through input piping 110, as indicated by arrow 802. In some embodiments, the RF power circuitry 124 is turned ON to apply an RF frequency to the plasma coil 122. Then, the plasma coil 122 generates an electric and/or magnetic field as indicated by lines 804. In some embodiments, the electric and/or magnetic fields (e.g., lines 804) from the plasma coil 122 transfer energy to the first and/or second noble gases from the first and second noble gas sources 114, 116 to form a plasma gas in the processing chamber 104. In some embodiments, the chuck circuitry 126 is turned ON to apply a bias to the wafer chuck 108 such that the plasma gas is attracted towards the biased wafer chuck 108 to bombard the wafer 129 with plasma gas for removal of the metal oxide residue 604. In FIG. 8A, the plasma gas and its attraction towards the wafer 129 is illustrated with arrows 806 within the processing chamber 104. In some embodiments, the vacuum pump 120, RF power circuitry 124, gas sources (e.g., oxygen source 112, first noble gas source 114, second noble gas source 116), chuck circuitry 126, and first and second heating elements 302, 304 are turned ON at a same or around a same time to begin the cleaning process.

Further, in some embodiments, the first and second heating elements 302, 304 are turned ON during the cleaning process. In FIG. 8A, arrows 808 illustrate the first heating element 302 being ON and emitting heat, and arrows 810 illustrate the second heating element 304 being ON and emitting heat. In some other embodiments, the first and second heating elements 302, 304 are omitted from the processing chamber 104, and thus, the cleaning process does not comprise turning ON first and second heating elements 302, 304. In yet other embodiments, the processing chamber 104 may comprise the first or second heating elements 302 or may comprise more than the first and second heating elements 302, 304.

FIG. 8B illustrates the cleaning process at a time after FIG. 8A and once the plasma gas (e.g., 806) begins to bombard with the metal oxide residue 604 on the wafer 129. As shown in the cross-sectional view 800B of FIG. 8B, as the plasma gas (e.g., 806) is bombarding the metal oxide residue 604, some of the metal oxide residue 604 is deposited onto the bell jar structure 128. This happens because, in some embodiments, the plasma gas (e.g., 806) removes the metal oxide residue 604 from the wafer 129 by chemically reducing the metal oxide residue 604 into metal and oxygen. In some instances, the metal and oxygen exit the processing chamber 104 through the output piping 118. However, in some other instances, the metal re-oxidizes within the processing chamber 104.

To prevent the metal from re-oxidizing onto the wafer 129, the oxygen gas from the oxygen source 112 as well as the first and second heating elements 302, 304 promote the metal to re-oxidize onto the bell jar structure 128 instead of the wafer 129. For example, the oxygen source 112 provides excess oxygen gas in the processing chamber 104 such that the metal re-oxidizes onto the bell jar structure 128 instead of depositing as a metal only on the bell jar structure 128. Further, the first and second heating elements 302, 304 are configured to direct heat towards the bell jar structure 128 to increase a temperature of the bell jar structure 128 and/or processing chamber 104 near the bell jar structure 128 to accelerate the metal-oxide reaction near the bell jar structure 128. Thus, after a certain time of the cleaning process, metal oxide residue 604 begins to form on the bell jar structure 128 to improve the cleaning process of removing the metal oxide residue 604 from the wafer 129.

In some embodiments, the second noble gas source 116 comprises a different noble gas than the first noble gas source 114 to increase the efficiency of the plasma gas (e.g., 806) bombardment towards the wafer 129. For example, in some embodiments, the first noble gas source 114 comprises argon, krypton, or some other suitable noble gas, and the second noble gas source 116 comprises a different noble gas than the first noble gas source 114 such as, for example, argon, krypton, or some other suitable noble gas.

As shown in the cross-sectional view 800C of FIG. 8C, the cleaning process may continue for a certain time period until the metal oxide residue 604 is removed from the topmost surfaces 134t of the conductive structures 134 and from other features of the wafer 129. In some embodiments, the metal oxide residue 604 forms on the inner sidewalls of the bell jar structure 128 and/or on the outer sidewalls of the bell jar structure 128.

Figure 9:
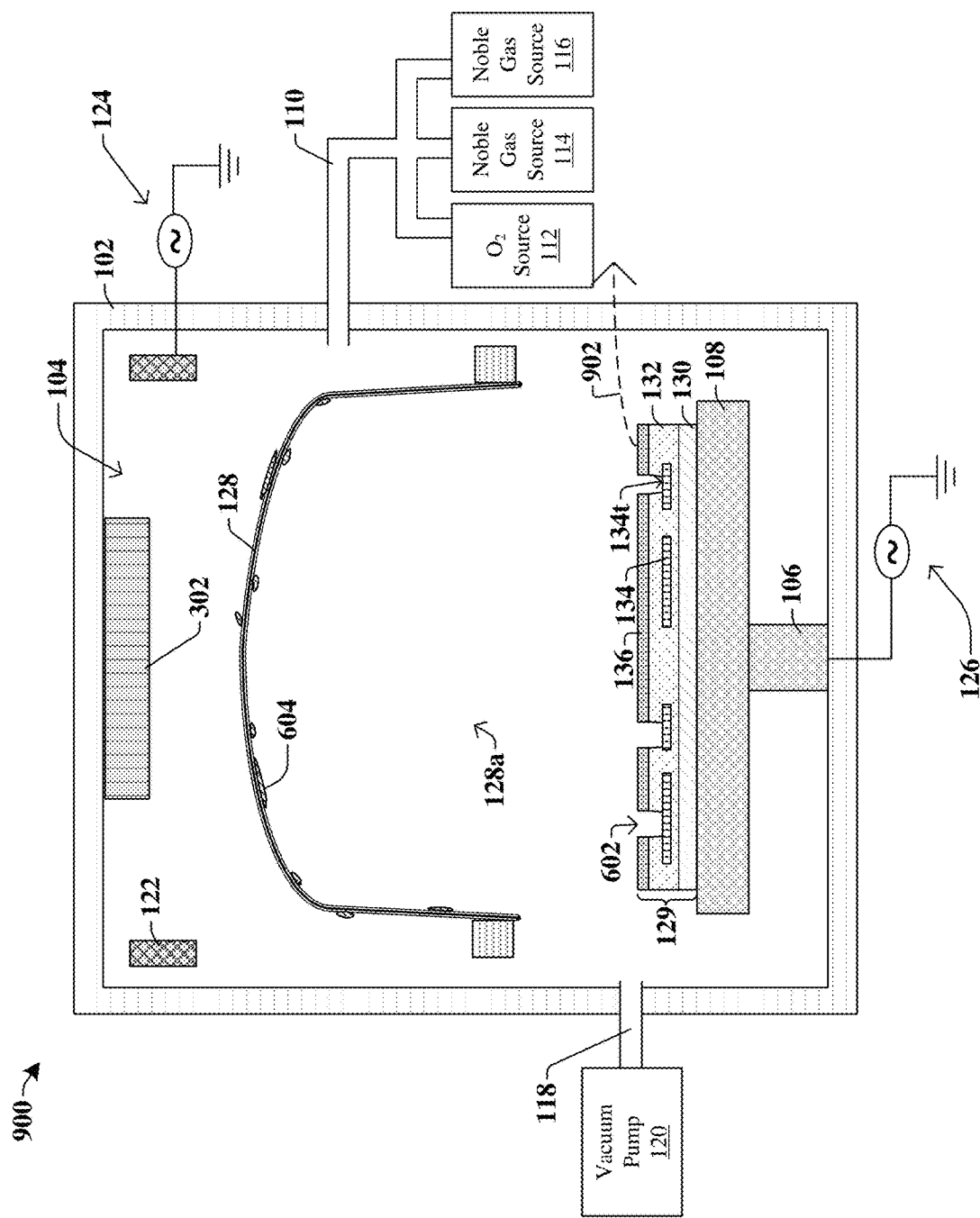

As shown in cross-sectional view 900 of FIG. 9, the cleaning process is ended by turning OFF the RF power circuitry 124, the chuck circuitry 126, the first heating element 302, the second heating element 304, and the gas sources (e.g., the oxygen source 112, the first noble gas source 114, the second noble gas source 116). In some embodiments, after the cleaning process, the wafer 129 is substantially free from metal oxide residue 604. In some embodiments, before the cleaning process (e.g., FIG. 7), a first amount (e.g., weight, volume, etc.) of metal oxide residue 604 is on the bell jar structure 128 and after the cleaning process (e.g., FIG. 9), a second amount (e.g., weight, volume, etc.) of metal oxide residue 604 is on the bell jar structure 128, wherein the second amount of metal oxide residue 604 is greater than the first amount of metal oxide residue 604.

In some embodiments, after the cleaning process, the processing chamber housing 102 is opened, and the wafer 129 is removed 902 from the wafer chuck 108 and processing chamber 104. In some embodiments, the wafer 129 is removed 902 using a transport robot such as, for example, the transport robot 414 of FIG. 4.

Figure 10:
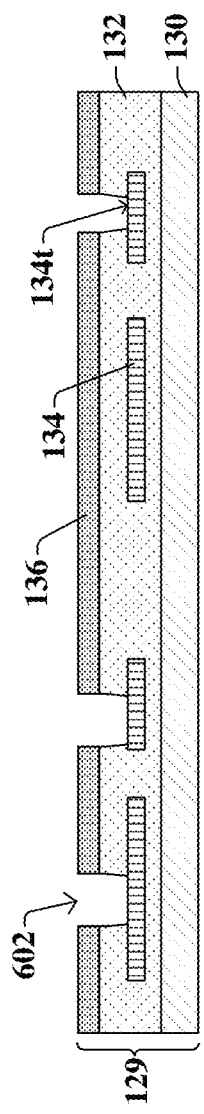

As shown in cross-sectional view 1000 of FIG. 10, in some embodiments, the topmost surfaces 134t of the conductive structures 134 are free from metal oxide residue (604 of FIG. 8C). In addition, in some embodiments, other surfaces of the wafer 129, such as, for example, the dielectric layers 132 and the masking structure 136 are also free from the metal oxide residue (604 of FIG. 8C).

Figure 11:
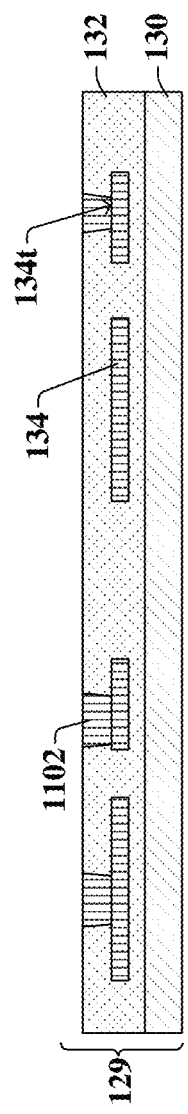

As shown in cross-sectional view 1100 of FIG. 11, in some embodiments, additional conductive structures 1102 are formed within the openings of the dielectric layers 132. In some embodiments, the additional conductive structures 1102 are formed by a deposition process (e.g., PVD, CVD, ALD, sputtering, etc.) of a conductive layer followed by a removal process (e.g., CMP) to remove portions of the conductive layer arranged over the dielectric layers 132. In some embodiments, the masking structure 136 is also removed during the formation of the additional conductive structures 1102. In some embodiments, the additional conductive structures 1102 comprise, for example, copper, aluminum, tungsten, tantalum, titanium, or some other suitable conductive material. In some embodiments, because the topmost surfaces 134t of the conductive structures 134 are cleaned of metal oxide residue (604 of FIG. 8C), the additional conductive structures 1102 adhere well to the conductive structures 134 and contact resistance between the conductive structures 134 and the additional conductive structures 1102 is improved without the presence of the metal oxide residue (604 of FIG. 8C). Therefore, the cleaning process of FIGS. 8A-C removes the metal oxide residue from the wafer 129 to improve physical and electrical properties of the overall semiconductor device.

Figure 12:
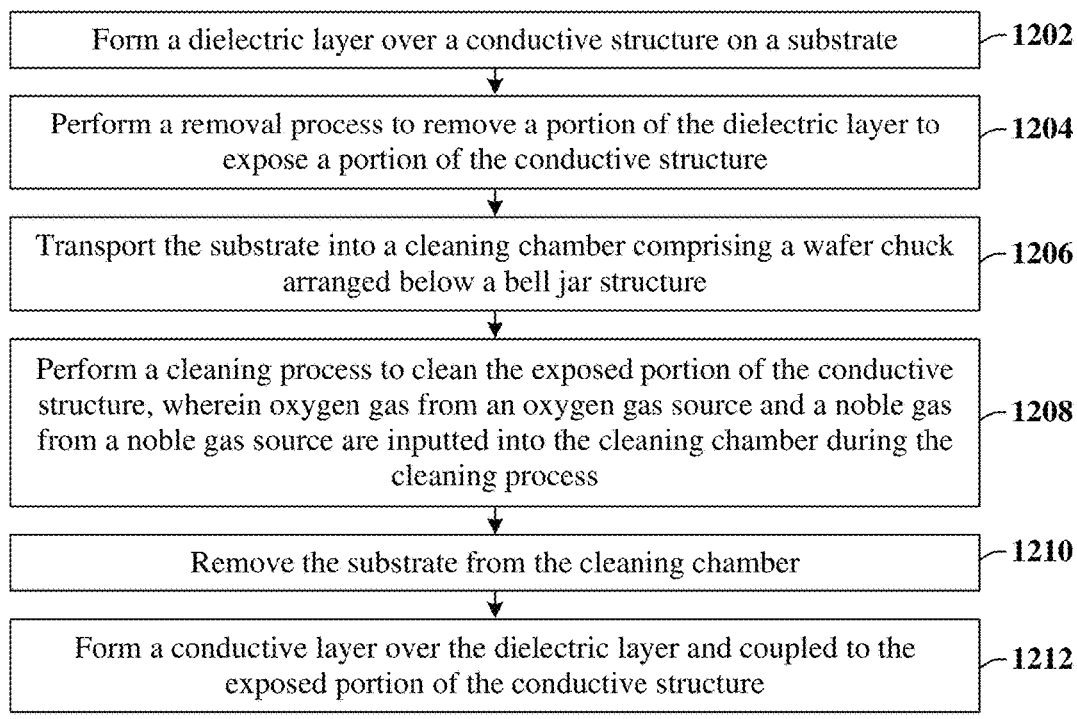
FIG. 12 illustrates a flow diagram of a method of some embodiments corresponding to the method of FIGS. 5-11.

FIG. 12 illustrates a flow diagram of some embodiments of a method 1200 corresponding to the method illustrated in FIGS. 5-11.

While method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1202, a dielectric layer is formed over a conductive structure on a substrate. FIG. 5 illustrates a cross-sectional view 500 of some embodiments corresponding to act 1202.

At act 1204, a removal process is performed to remove a portion of the dielectric layer to expose a portion of the conductive structure. FIG. 6 illustrates a cross-sectional view 600 of some embodiments corresponding to act 1204.

At act 1206, the substrate is transported into a cleaning chamber comprising a wafer chuck arranged below a bell jar structure. FIG. 7 illustrates a cross-sectional view 700 of some embodiments corresponding to act 1206.

At act 1208, a cleaning process is performed to clean the exposed portion of the conductive structure. During the cleaning process, oxygen gas from and oxygen source and noble gas from a noble gas source are inputted into the cleaning chamber. FIGS. 8A-C illustrate cross-sectional views 800A-800C of some embodiments corresponding to act 1208.

At act 1210, the substrate is removed from the cleaning chamber. FIG. 9 illustrates a cross-sectional view 900 of some embodiments corresponding to act 1210.

At act 1212, a conductive layer is formed over the dielectric layer and coupled to the exposed portion of the conductive structure. FIG. 11 illustrates a cross-sectional view 1100 of some embodiments corresponding to act 1212.

Therefore, the present disclosure relates to a cleaning apparatus and method of using the cleaning apparatus to remove metal oxide residue from a wafer and promote redeposition of metal oxide onto a bell jar structure instead of the wafer by using oxygen gas, noble gas, and/or heating elements.

Accordingly, in some embodiments, the present disclosure relates to a process tool, comprising: a chamber housing defining a processing chamber; a wafer chuck arranged within the processing chamber and configured to hold a substrate; a bell jar structure arranged over the wafer chuck, wherein an opening of the bell jar structure faces the wafer chuck; a plasma coil arranged over the bell jar structure; and an oxygen source coupled to the processing chamber and configured to input oxygen gas into the processing chamber.

In other embodiments, the present disclosure relates to a process tool comprising: a chamber housing defining a processing chamber in vacuum; a wafer chuck arranged within the processing chamber and configured to hold a substrate; a plasma coil arranged over the wafer chuck; an oxygen source coupled to the processing chamber and configured to input oxygen gas into the processing chamber; a heating element arranged within the processing chamber and configured to increase a temperature of the processing chamber; and a bell jar structure arranged between the wafer chuck and the plasma coil, wherein an opening of the bell jar structure faces the wafer chuck.

In yet other embodiments, the present disclosure relates to a method comprising: forming a dielectric layer over a conductive structure on a substrate; performing a removal process to remove a portion of the dielectric layer to expose a portion of the conductive structure; transporting the substrate into a cleaning chamber comprising a wafer chuck arranged below a bell jar structure; performing a cleaning process to clean the exposed portion of the conductive structure by: turning on a noble gas source to introduce a noble gas within the cleaning chamber, turning on an oxygen gas source to introduce oxygen within the cleaning chamber, applying a bias to a plasma coil to form a plasma gas within the cleaning chamber, and applying a bias to the wafer chuck; removing the substrate from the cleaning chamber; and forming a conductive layer over the dielectric layer and coupled to the exposed portion of the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a conductive structure on a substrate;
   performing a removal process to remove a portion of the dielectric layer to expose a portion of the conductive structure;
   transporting the substrate into a cleaning chamber comprising a wafer chuck arranged below a bell jar structure;
   performing a cleaning process to clean the exposed portion of the conductive structure by:
      turning on a noble gas source to introduce a noble gas within the cleaning chamber,
      turning on an oxygen gas source to introduce an oxygen gas within the cleaning chamber, wherein the noble gas and the oxygen gas are introduced into the cleaning chamber along an input that is laterally outside of the bell jar structure,
      applying a first bias to a plasma coil to form a plasma gas within the cleaning chamber, and
      applying a second bias to the wafer chuck;
      directing heat from a heating element directly over a top of the bell jar structure towards the bell jar structure, to increase a temperature of the bell jar structure;
   removing the substrate from the cleaning chamber; and
   forming a conductive layer over the dielectric layer and coupled to the exposed portion of the conductive structure.

2. The method of claim 1, wherein before the performing of the cleaning process, surfaces of the bell jar structure comprise a first amount of metal oxide residue, and wherein after the cleaning process, the surfaces of the bell jar structure comprise a second amount of metal oxide residue that is greater than the first amount.

3. The method of claim 1, further comprising:
   directing additional heat from a second heating element disposed along outer sidewalls of the bell jar structure towards the bell jar structure, wherein the input is vertically between the heating element and the second heating element.

4. The method of claim 1, wherein the heating element is disposed between the top of the bell jar structure and an uppermost surface of a housing surrounding the plasma coil.

5. The method of claim 1, wherein after the cleaning process, metal oxide residue is arranged on inner and outer surfaces of the bell jar structure.

6. A method, comprising:
   providing a substrate into a cleaning chamber comprising a wafer chuck arranged below a bell jar, the substrate comprising a metal oxide disposed over a semiconductor body;
   providing a first noble gas within the cleaning chamber;
   providing a second noble gas within the cleaning chamber, the second noble gas being different than the first noble gas;
   providing an oxygen gas within the cleaning chamber;
   generating a plasma within the cleaning chamber after providing the first noble gas, the second noble gas, and the oxygen gas into the cleaning chamber;
   directing heat from one or more heating elements directly over the bell jar towards the bell jar to increase a temperature of the bell jar concurrent to the oxygen gas being provided within the cleaning chamber;
   applying a bias to the wafer chuck, wherein the bias attracts ions from the plasma towards the substrate to remove the metal oxide as metal residue and oxygen; and
   wherein the oxygen gas oxidizes the metal residue that has been redeposited onto the bell jar to remove the metal residue from the bell jar.

7. The method of claim 6, wherein the one or more heating elements comprise multiple lamps spaced apart from one another and surrounding an outer sidewall of the bell jar.

8. The method of claim 6, wherein the first noble gas is argon.

9. The method of claim 8, wherein the second noble gas is krypton.

10. The method of claim 6, wherein the one or more heating elements comprise a first heating element disposed directly over a top of the bell jar and vertically below an upper surface of the cleaning chamber surrounding a plasma coil that is used to generate the plasma.

11. The method of claim 10, wherein the one or more heating elements further comprise a second heating element disposed along a side of the bell jar, the second heating element vertically between the substrate and the first heating element.

12. The method of claim 11, wherein the first heating element comprises a heating lamp and the second heating element comprises a heat jacket.

13. A method, comprising:
   providing a substrate into a processing chamber and below a bell jar structure, the substrate comprising a metal and oxygen;
   providing a first noble gas within the processing chamber;
   providing an oxygen gas within the processing chamber;
   generating a plasma within the processing chamber;
   attracting ions from the plasma towards the substrate to bombard and remove the metal and the oxygen from the substrate, wherein the metal is redeposited onto one or more surfaces of the bell jar structure;
   wherein the oxygen gas interacts with the metal that has been redeposited onto the one or more surfaces so as to remove the metal from the one or more surfaces; and directing heat from a heating element directly over a top of the bell jar structure towards the bell jar structure while the first noble gas and the oxygen gas are being provided within the processing chamber, wherein the heat increases a temperature of the bell jar structure and to accelerate a reaction between the oxygen gas and the metal that has been redeposited onto the one or more surfaces.

14. The method of claim 13, wherein the metal is redeposited onto both interior and exterior surfaces of the bell jar structure.

15. The method of claim 13, further comprising:
directing additional heat from a second heating element disposed along outer sidewalls of the bell jar structure towards the bell jar structure, wherein the first noble gas and the oxygen gas are introduced into the processing chamber at an inlet that is vertically between the heating element and the second heating element.

16. The method of claim 13, further comprising:
providing a second noble gas within the processing chamber, wherein the first noble gas and the second noble gas are different noble gases.

17. The method of claim 16, wherein the first noble gas is argon and the second noble gas is krypton.

18. The method of claim 13, wherein before a cleaning process a first amount of metal oxide residue is on the bell jar structure and after the cleaning process a second amount of metal oxide residue is on the bell jar structure, the second amount of metal oxide residue is greater than the first amount of metal oxide residue.

19. The method of claim 18, wherein the heating element is disposed directly between the top of the bell jar structure and a top of the processing chamber.

20. The method of claim 19, further comprising:
directing additional heat from a second heating element disposed along a side of the bell jar structure towards the bell jar structure, the second heating element vertically between the substrate and the heating element and laterally outside of the substrate.

* * * * *